United States Patent [19]

Leung

[11] Patent Number: 5,047,979
[45] Date of Patent: Sep. 10, 1991

[54] HIGH DENSITY SRAM CIRCUIT WITH RATIO INDEPENDENT MEMORY CELLS

[75] Inventor: Wingyu Leung, Cupertino, Calif.

[73] Assignee: Integrated Device Technology, Inc., Santa Clara, Calif.

[21] Appl. No.: 538,998

[22] Filed: Jun. 15, 1990

[51] Int. Cl.$^5$ ............................................. G11C 13/00
[52] U.S. Cl. ................................ 365/154; 365/189.01
[58] Field of Search .................... 365/154, 189.01, 182

[56] References Cited

U.S. PATENT DOCUMENTS 4,954,992  9/1990  Kumanoya et al. ................. 365/207

Primary Examiner—Terrell W. Fears
Attorney, Agent, or Firm—Thomas E. Schatzel

[57] ABSTRACT

Briefly, a high density, static, random access memory (SRAM) circuit with ratio independent memory cells employs a number (plurality) of (4T-2R) or (6T) type SRAM cells and a regenerative sense amplifier. Each of the SRAM cells of the present invention differs from corresponding, prior art type SRAM cells in that the SRAM cells of the present invention each include transistors of similar size (channel width).

10 Claims, 2 Drawing Sheets

HIGH DENSITY SRAM CIRCUIT WITH RATIO INDEPENDENT MEMORY CELLS

TECHNICAL FIELD

The present invention relates to CMOS-type digital integrated circuit generally and more particularly to static, random access memory cells.

BACKGROUND ART

Static, random access memories (SRAMs) employ a number of cells, each for storing a single binary bit of information. Typical SRAM cell structures include what is commonly referred to as a four transistor, two resistor (4T-2R) SRAM cell and what is commonly referred to as a six transistor (6T) SRAM cell. A (4T-2R) SRAM cell is illustrated in (prior art) FIG. 1 of the drawing generally designated by the number 100. SRAM cell 100 is shown to include four, N-channel, transistors, which are designated 110, 112, 114, and 116, and two (load) resistors, which are designated 120 and 122. Transistor 110 is configured as a transfer transistor with the source (or drain) (end of the channel) of the transistor connected to an (active-high) bit (input/-output) line (BL), which is designated 130. The gate of transistor 110 is connected to an (active-high) word (control) line (WL), which is designated 132. The drain (or source) (end of the channel) of transistor 110 is coupled by resistor 120 to a power supply potential (Vcc), which is represented by a line 134. Transistor 112 is configured as a pull-down transistor with the transistor source connected to circuit ground (Vss), with the transistor gate coupled by resistor 122 to power supply line 134, and with the transistor drain connected to the drain of transistor 110. Transistor 114 is also configured as a pull-down transistor with the transistor source connected to circuit ground, with the transistor gate connected to the drain of transistor 110, and with the transistor drain connected to the gate of transistor 112. Finally, transistor 116 is, also, configured as a transfer transistor with the transistor source connected to the gate of transistor 112, with the transistor gate connected to word line (WL) 132, and with the transistor drain connected to an (active-low) bit (input/output) line (/BL), which is designated 140. The lines connecting the cross-coupling gates and drains of the pull-down transistors are designated 150 and 152.

A six transistor (6T) SRAM cell is illustrated in (prior art) FIG. 2 generally designated by the number 200. SRAM cell 200 is shown to include four, N-channel, transistors, which are designated 210, 212, 214, and 216, and two, P-channel, (load) transistors, which are designated 220 and 222. The transistors are configured with the source of transistor 210 connected to an (active-high) bit (input/-output) line (BL), which is designated 230, with the transistor gate connected to an (active-high) word (control) line (WL), which is designated 232, and with the transistor drain connected to a node which is connected to the source of transistor 220, to the drain of transistor 212, and to the gate of both transistors 214 and 222. Connected to another node is the gate of both transistors 220 and 212, the source of transistor 222, the drain of transistor 214, and the source of transistor 216. The drain of both transistors 220 and 222 are connected to a power supply potential (Vcc), which is represented by a line 234; and, the source of both transistors 212 and 214 are connected to circuit ground (Vss). The gate of transistor 216 is connected to word line (WL) 232; and, the drain of the transistor is connected to an (active-low) bit (input/output) line (/BL), which is designated 240.

In the implementation of high density SRAMs, the cell size is one of the more critical parameters, as it determines the total area of the memory array and, therefore, the chip size. Heretofore, for poly-silicon-resistor load (4T-2R) SRAM cells, in the conventional planar layout, the size of the pull-down transistor (114) has accounted for a significant portion of the cell area. This is because, heretofore, the pull-down transistor (114) size had to be around three times that of the transfer transistor (116) to prevent the state of the cell from being upset when transfer transistor (116) is turned on when the state of the cell is being read.

The reader may find of interest the U.S. Pat. Nos. 4,794,561 and 4,876,215 of Fu-Chieh Hsu.

DISCLOSURE OF THE INVENTION

The primary object of the present invention is to provide a static, random access memory (SRAM) circuit of minimum size.

Another object of the present invention is to provide a high speed, static, random access memory (SRAM) circuit.

Briefly, the presently preferred embodiment of a high density, static, random access memory (SRAM) circuit with ratio independent memory cells in accordance with the present invention employs a number (plurality) of (4T-2R) or (6T) type SRAM cells and a regenerative sense amplifier. Each of the SRAM cells of the present invention differ from corresponding, prior art type SRAM cells in that the SRAM cells of the present invention each include transistors of similar size (channel width).

These and other objects of the present invention will no doubt become apparent to those skilled in the art after having read the detailed description of the presently preferred embodiments of the present invention which is illustrated in the figures of the drawing.

BRIEF DESCRIPTION OF THE FIGURES IN THE DRAWING

Figure 1:
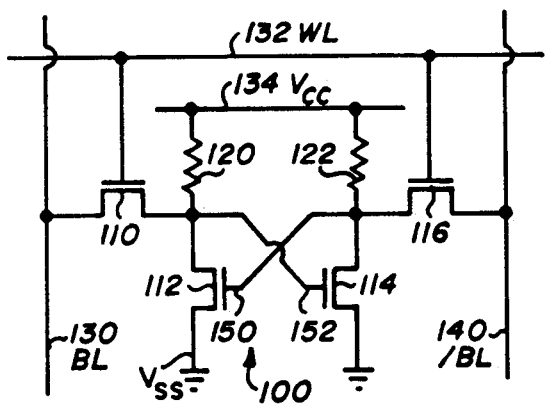
FIG. 1 is a schematic diagram of a prior art type (4T-2R) SRAM cell.
Figure 2:
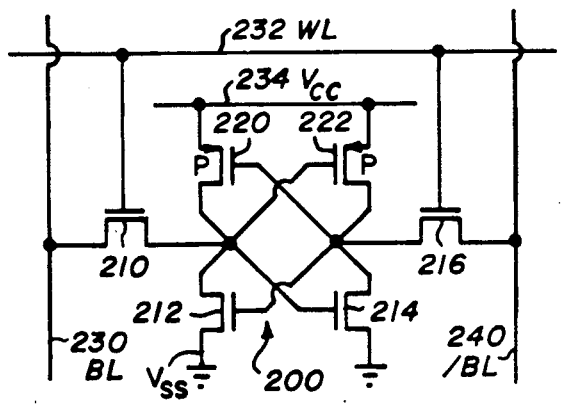
FIG. 2 is a schematic diagram of a prior art type (6T) SRAM cell.
Figure 3:
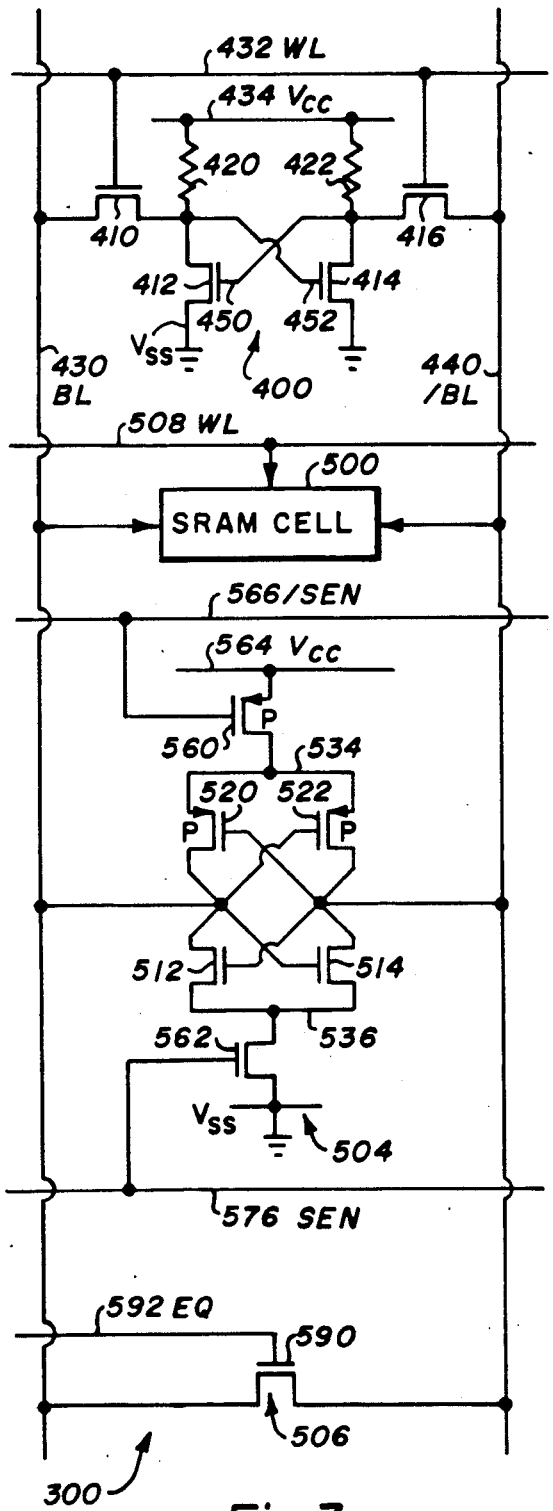
Figure 4:
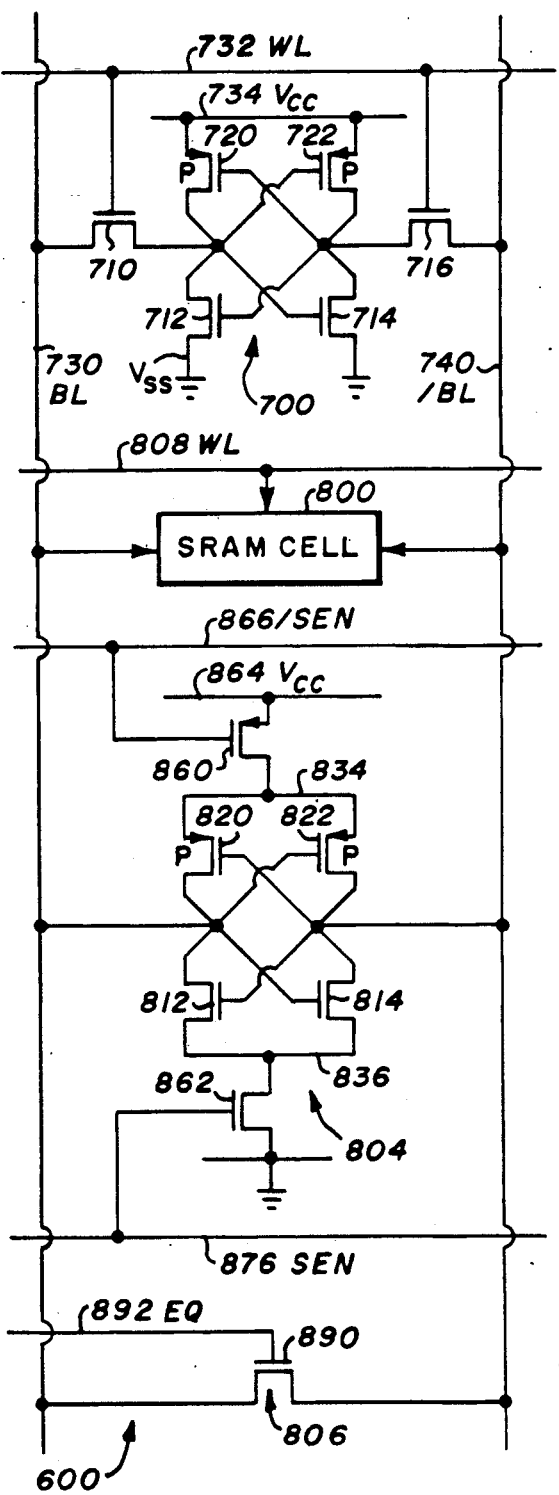

FIG. 3 is the presently preferred embodiment of a four transistor, two resistor (4T-2R), high density, static, random access memory (SRAM) circuit with ratio independent memory cells in accordance with the present invention; and FIG. 4 is the presently preferred embodiment of a six transistor ), high density, static, random access memory (SRAM) circuit with ratio independent memory cells in accordance with the present invention.

BEST MODE FOR CARRYING OUT THE INVENTION

The presently preferred embodiment of a four transistor, two resistor (4T-2R), high density, static, random access memory (SRAM) circuit with ratio independent memory cells in accordance with the present invention is illustrated in FIGS. 3 of the drawing generally designated by the number 300. Circuit 300 employs a SRAM cell, generally designated by the number 400. SRAM cell 400 is similar to the above mentioned, prior art, (4T-2R) SRAM cell (100). Like SRAM cell 100, SRAM cell 400 includes four, N-channel, transistors, which are, in this case, designated 410, 412, 414, and 416, and two (load) resistors, which are, in this case, designated 420 and 422. Also, like SRAM cell 100, the transistors and resistors of SRAM cell 400 are similarly configured. Transistor 410 is configured as a transfer transistor with the source (or drain) (end of the channel) of the transistor connected to an (active-high) bit (input/output) line (BL), which is designated 430. The gate of transistor 410 is connected to an (active-high) word (control) line (WL), which is designated 432. The drain (or source) (end of the channel) of transistor 410 is coupled by resistor 420 to a power supply potential (Vcc), which is represented by a line 434. Transistor 412 is configured as a pull-down transistor with the transistor source connected to circuit ground (Vss), with the transistor gate coupled by resistor 422 to power supply line 434, and with the transistor drain connected to the drain of transistor 410. Transistor 414 is also configured as a pull-down transistor with the transistor source connected to circuit ground, with the transistor gate connected to the drain of transistor 410, and with the transistor drain connected to the gate of transistor 412. Finally, transistor 416 is, also, configured as a transfer transistor with the transistor source connected to the gate of transistor 412, with the transistor gate connected to word line (WL) 432, and with the transistor drain connected to an (active-low) bit (input/output) line (/BL), which is designated 440. The lines connecting the cross-coupling gates and drains of the pull-down transistors are designated 450 and 452.

However, SRAM cell 400, of the present invention, differ from the above mentioned, prior art, (4T-2R) SRAM cell (100) in that the size (channel width) of each of the transistors (410, 412, 414, and 416) is the same (equal).

In addition, the presently preferred embodiment of (4T-2R) SRAM circuit 300 employs a number (plurality) of, additional, SRAM cells, which are collectively represented by a cell 500, a regenerative sense amplifier, which is generally designated 504, and a bit lines equalization (precharge) circuit, which is generally designated 506.

Each of the additional SRAM cells (500), which are each similar to SRAM cell 400, are similarly configured. Each of the SRAM cells is connected to (active-high) bit (input/output) line (BL) 430 and to (active-low) bit (input/output) line (/BL) 440. Further, each of the SRAM cells is connected to a respective (active-high) word (control) line (WL), which is represented by a line 508.

Regenerative sense amplifier 504 includes two, N-channel, transistors, which are designated 512 and 514, and two, P-channel, (load) transistors, which are designated 520 and 522. The transistors are configured with the (active-high) bit (input/output) line (BL) 430 connected to the source of transistor 520, to the drain of transistor 512, and to the gate of both transistors 514 and 522. Connected to (active-low) bit (input/output) line (/BL) 440 is the gate of both transistors 520 and 512, the source of transistor 522, and the drain of transistor 514. The drain of both transistors 520 and 522 are connected to a line 534; and, the source of both transistors 512 and 514 are connected to a line 536. In addition, regenerative sense amplifier 504 includes a P-channel, transistor, which is designated 560, and an N-channel, transistor, which is designated 562. Transistor 560 is configured with the transistor source connected to a power supply potential (Vcc), which is represented by a line 564, with the transistor gate connected to an (active-low) sense amplifier selecting line (/SEN) 566, and with the transistor drain connected to line 534. Transistor 562 is configured with the transistor source connected to circuit ground (Vss), with the transistor gate connected to an (active-high) sense amplifier selecting line (SEN) 576, and with the transistor drain connected to line 536.

Bit lines equalization (precharge) circuit 506 includes an N-channel transistor 590, which is configured with the transistor gate connected to an (active-high) equalization control line (EQ) 592, with one of the ends of the transistor channel (the source or drain) connected to the (active-high) bit (input/output) line (/BL) 430, and with the other one of the ends of the transistor channel (the source or drain) connected to the (active-low) bit (input/output) line (/BL) 440.

Operationally, before signals of active state are developed on the word and sense amplifier select lines (432, 508, 576, and 566), a signal of active state (a high logic potential level signal) is, briefly, developed on equalization control line (EQ) 592. Responsive thereto, bit lines equalization (precharge) circuit 506 transistor 590 is operative to conduct charge between the bit lines (430 and 440), precharging the bit lines to equal potential levels of approximately one half of the power supply potential level.

After the state of the equalization control line (EQ) 592 signal is returned to the inactive state and before signals of active state are developed on the sense amplifier select lines (576 and 566), a signal of active state (high logic potential level) is developed on one of the word lines (WL) (432 or 508). Responsive thereto, bit lines (430 and 440) begin to charge each to a potential the logic level of which represents the state of the binary bit of information stored in the selected SRAM cell. Specifically, when a high logic potential level (active) signal is developed on word line (WL) 432, the bit lines (430 and 440) begin to charge (/discharged) each to a potential the logic level of which represents the state of the binary bit of information stored in the selected SRAM cell (400). When SRAM cell 400 is in the state in which transistor 412 is "off" and transistor 414 is "on," resistor 420 begins to charge bit line (BL) 430 to a high logic potential level; and, transistor 414 begins to discharge bit line (/BL) 440 to a low logic potential level.

While the signal developed on the word line (WL) still has an active state (high logic potential level), signals of active state are developed on the sense amplifier select lines (a high logic potential level signal being developed on sense amplifier select line (SEN) 576 and a low logic potential level signal being developed on sense amplifier select line (/SEN) 566), the charge on the bit lines drive regenerative sense amplifier 504 into the state which corresponds to the state of the binary bit of information stored in the selected SRAM cell (400).

After the regenerative sense amplifier (504) "reads" the state of the binary bit of information stored in the selected SRAM cell (400), the amplifier "rewrites" the state of the binary bit of information back into the selected SRAM cell.

It is important to note that, due to the regenerative nature of the regenerative sense amplifier (504) and due to the differential nature of the signals driving the inputs of the amplifier, the amplifier speeds up development of the signals on the bit lines. Further, the sense amplifier amplifies the small differential potential levels developed on the bit lines to full logic levels. Finally, the sense amplifier provides high drive capability.

The presently preferred embodiment of a six transistor (6T), high density, static, random access memory (SRAM) circuit with ratio independent memory cells in accordance with the present invention is illustrated in FIGS. 4 of the drawing generally designated by the number 600. Circuit 600 employs a SRAM cell, generally designated by the number 700. SRAM cell 700 is similar to the above mentioned, prior art, (6T) SRAM cell (200). Like SRAM cell 200, SRAM cell 700 includes four, N-channel, transistors, which are, in this case, designated 710, 712, 714, and 716, and two, P-channel, (load) transistors, which are, in this case, designated 720 and 722. Also, like SRAM cell 200, the transistors and resistors of SRAM cell 700 are similarly configured. The transistors are configured with the source of transistor 710 connected to an (active-high) bit (input/output) line (BL), which is designated 730, with the transistor gate connected to an (active-high) word (control) line (WL), which is designated 732, and with the transistor drain connected to a node which is connected to the source of transistor 720, to the drain of transistor 712, and to the gate of both transistors 714 and 722. Connected to another node is the gate of both transistors 720 and 712, the source of transistor 722, the drain of transistor 714, and the source of transistor 716. The drain of both transistors 720 and 722 are connected to a power supply potential (Vcc), which is represented by a line 734; and, the source of both transistors 712 and 714 are connected to circuit ground (Vss). The gate of transistor 716 is connected to word line (WL) 732; and, the drain of the transistor is connected to an (active-low) bit (input/output) line (/BL), which is designated 740.

However, SRAM cell 700, of the present invention, differ from the above mentioned, prior art, (6T) SRAM cell (200) in that the size (channel width) of each of the transistors (710, 712, 714, 716, 720 and 722) is the same (equal).

In addition, the presently preferred embodiment of (4T) SRAM circuit 600 employs a number (plurality) of, additional, SRAM cells, which are collectively represented by a cell 800, a regenerative sense amplifier, which is generally designated 804, and a bit lines equalization (precharge) circuit, which is generally designated 806.

Each of the additional SRAM cells (800), which are each similar to SRAM cell 700, are similarly configured. Each of the SRAM cells is connected to (active-high) bit (input/output) line (BL) 730 and to (active-low) bit (input/output) line (/BL) 740. Further, each of the SRAM cells is connected to a respective (active-high) word (control) line (WL), which is represented by a line 808.

Regenerative sense amplifier 804 includes two, N-channel, transistors, which are designated 812 and 814, and two, P-channel, (load) transistors, which are designated 820 and 822. The transistors are configured with the (active-high) bit (input/output) line (BL) 730 connected to the source of transistor 820, to the drain of transistor 812, and to the gate of both transistors 814 and 822. Connected to (active-low) bit (input/output) line (/BL) 740 is the gate of both transistors 820 and 812, the source of transistor 822, and the drain of transistor 814. The drain of both transistors 820 and 822 are connected to a line 834; and, the source of both transistors 812 and 814 are connected to a line 836. In addition, regenerative sense amplifier 804 includes a P-channel, transistor, which is designated 860, and an N-channel, transistor, which is designated 862. Transistor 860 is configured with the transistor source connected to a power supply potential (Vcc), which is represented by a line 864, with the transistor gate connected to an (active-low) sense amplifier selecting line (/SEN) 866, and with the transistor drain connected to line 834. Transistor 862 is configured with the transistor source connected to circuit ground (Vss), with the transistor gate connected to an (active-high) sense amplifier selecting line (SEN) 876, and with the transistor drain connected to line 836.

Bit lines equalization (precharge) circuit 806 includes an N-channel transistor 890, which is configured with the transistor gate connected to an (active-high) equalization control line (EQ) 892, with one of the ends of the transistor channel (the source or drain) connected to the (active-high) bit (input/output) line (/BL) 740, and with the other one of the ends of the transistor channel (the source or drain) connected to the (active-low) bit (input/output) line (/BL) 740.

In the presently preferred embodiment, the various components of SRAM circuit 300 are all integrated into a single device using CMOS technology, as are the various components of SRAM circuit 600.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A static, random access memory circuit comprising in combination:
    a first bit line (430);
    a second bit line (440);
    a memory cell (400) including,
        a word line (432),
        a first resistor (420),
        a second resistor (422),
        a first transistor (410) having a gate connected to said memory cell word line (432) and a channel having a first end connected to said first bit line (430) and a second end coupled by said memory cell first resistor (420) to (434) a power supply potential,
        a second transistor (416) having a gate connected to said memory cell word line (432) and a channel having a first end connected to said second bit line (430) and a second end coupled by said memory cell second resistor (422) to (434) the power supply potential,
        a third transistor (412) having a gate connected to said memory cell second transistor (416) channel second end and a channel connected between said memory cell first transistor (410) channel second end and a circuit ground potential, and
        a fourth transistor (414) having a gate connected to said memory cell first transistor (410) channel second end and a channel connected between said memory cell second transistor (416) channel second end and the circuit ground potential; and
    a regenerative sense amplifier (504) including,
        a regenerative sense amplifier first line (534),
        a regenerative sense amplifier second line (536), a first transistor (512) having a gate connected to said second bit line (440) and a channel connected between said first bit line (430) and said regenerative sense amplifier second line (536), a second transistor (514) having a gate connected to said first bit line (430) and a channel connected between said second bit line (440) and said regenerative sense amplifier second line (536), a third transistor (520) having a gate connected to said second bit line (440) and a channel connected between said regenerative sense amplifier first line (534) and said first bit line (430), and a fourth transistor (522) having a gate connected to said first bit line (430) and a channel connected between said regenerative sense amplifier first line (534) and said second bit line (440).

2. A static, random access memory circuit as recited in claim 1 wherein said regenerative sense amplifier (504) further includes, a first sense amplifier selecting line (566), a second sense amplifier selecting line (576), a fifth transistor (560) having a gate connected to said regenerative sense amplifier first sense amplifier selecting line (566) and a channel connected between said regenerative sense amplifier first line (534) and the power supply potential (564) and a sixth transistor (562) having a gate connected to said regenerative sense amplifier second sense amplifier selecting line (576) and a channel connected between said regenerative sense amplifier second line (536) and the circuit ground potential.

3. A static, random access memory circuit as recited in claim 2 wherein said memory cell first (410), second (416), third (412), and fourth (414) transistors each have a channel width which is within fifty percent of a predetermined width.

4. A static, random access memory circuit as recited in claim 1, wherein said memory cell first (410), second (416), third (412), and fourth (414) transistors each have a channel width which is within fifty percent of a predetermined width.

5. A static, random access memory circuit as recited in claim 1 further comprising a bit lines equalization circuit including, a equalization control line (592), and a transistor (590) having a gate connected to said bit lines equalization circuit equalization control line (592) and a channel having a first end connected to said first bit line (430) and a second end connected to said second bit line (440).

6. A static, random access memory circuit comprising in combination:

a first bit line (730);

a second bit line (740);

a memory cell (700) including,
 a word line (732),
 a first resistor (720),
 a second resistor (722),
 a first transistor (710) having a gate connected to said memory cell word line (732) and a channel having a first end connected to said first bit line (730) and a second end,
 a second transistor (716) having a gate connected to said memory cell word line (732) and a channel having a first end connected to said second bit line (730) and a second end, a third transistor (712) having a gate connected to said memory cell second transistor (716) channel second end and a channel connected between said memory cell first transistor (710) channel second end and a circuit ground potential, and a fourth transistor (714) having a gate connected to said memory cell first transistor (710) channel second end and a channel connected between said memory cell second transistor (716) channel second end and the circuit ground potential; and a fifth transistor (720) having a gate connected to said memory cell second transistor (716) channel second end and a channel connected from said memory cell first transistor (710) channel second end to (734) a power supply potential, and a sixth transistor (722) having a gate connected to said memory cell first transistor (710) channel second end and a channel connected from said memory cell second transistor (716) channel second end to (734) the power supply potential a regenerative sense amplifier (804) including, a regenerative sense amplifier first line (834), a regenerative sense amplifier second line (836), a first transistor (812) having a gate connected to said second bit line (440) and a channel connected between said first bit line (430) and said regenerative sense amplifier second line (836), a second transistor (814) having a gate connected to said first bit line (430) and a channel connected between said second bit line (440) and said regenerative sense amplifier second line (836), a third transistor (820) having a gate connected to said second bit line (440) and a channel connected between said regenerative sense amplifier first line (834) and said first bit line (430), and a fourth transistor (822) having a gate connected to said first bit line (430) and a channel connected between said regenerative sense amplifier first line (834) and said second bit line (440).

7. A static, random access memory circuit as recited in claim 6 wherein said regenerative sense amplifier (804) further includes, a first sense amplifier selecting line (866), a second sense amplifier selecting line (876), a fifth transistor (860) having a gate connected to said regenerative sense amplifier first sense amplifier selecting line (866) and a channel connected between said regenerative sense amplifier first line (834) and the power supply potential (864) and a sixth transistor (862) having a gate connected to said regenerative sense amplifier second sense amplifier selecting line (876) and a channel connected between said regenerative sense amplifier second line (836) and the circuit ground potential.

8. A static, random access memory circuit as recited in claim 7 wherein said memory cell first (710), second (716), third (712), and fourth (714) transistors each have a channel width which is within fifty percent of a predetermined width.

9. A static, random access memory circuit as recited in claim 6 wherein said memory cell first (710), second (716), third (712), and fourth (714) transistors each have a channel width which is within fifty percent of a predetermined width.

10. A static, random access memory circuit as recited in claim 6 further comprising a bit lines equalization circuit.

* * * * *